(12) United States Patent
Irie et al.

(10) Patent No.: US 11,512,247 B2
(45) Date of Patent: Nov. 29, 2022

(54) PHOSPHOR PLATE

(71) Applicant: CoorsTek KK, Tokyo (JP)

(72) Inventors: Masaki Irie, Kanagawa (JP); Yuma Suzuki, Kanagawa (JP)

(73) Assignee: CoorsTek KK, Tokyo (JP)

( * ) Notice: Subject to any disclaimer, the term of this patent is extended or adjusted under 35 U.S.C. 154(b) by 0 days.

(21) Appl. No.: 17/520,444

(22) Filed: Nov. 5, 2021

(65) Prior Publication Data

US 2022/0204841 A1    Jun. 30, 2022

(30) Foreign Application Priority Data

Dec. 28, 2020  (JP) .............................. JP2020-218582
Oct. 1, 2021   (JP) .............................. JP2021-162683

(51) Int. Cl.
*H01L 33/50* (2010.01)
*C09K 11/77* (2006.01)

(52) U.S. Cl.
CPC .......... *C09K 11/7721* (2013.01); *H01L 33/50* (2013.01)

(58) Field of Classification Search
CPC ..... H01L 33/50; H01L 33/501; H01L 33/502; H01L 33/505; C09K 11/7721

(Continued)

(56) References Cited

U.S. PATENT DOCUMENTS

2013/0257264 A1 * 10/2013 Tamaki ................. H01L 33/502
                                                            313/503
2018/0244986 A1   8/2018 Yanagihara et al.
(Continued)

FOREIGN PATENT DOCUMENTS

JP        2018-172628 A    11/2018

*Primary Examiner* — Christopher M Raabe
(74) *Attorney, Agent, or Firm* — Procopio, Cory, Hargreaves & Savitch LLP

(57) ABSTRACT

The present invention relates to a phosphor plate including a sintered body including $(Y_{1-x-y}, Gd_x, Ce_y)_3Al_5O_{12}$ particles and $Al_2O_3$ particles, in which $0.07 \leq x \leq 0.11$ and $0.010 \leq y \leq 0.015$ are satisfied, the $(Y_{1-x-y}, Gd_x, Ce_y)_3Al_5O_{12}$ particles in the sintered body has an average particle diameter of 4 μm or more and 6 μm or less, the $(Y_{1-x-y}, Gd_x, Ce_y)_3Al_5O_{12}$ particles has a concentration of 20 vol % or more and 30 vol % or less with respect to a total amount 100 vol % of the $(Y_{1-x-y}, Gd_x, Ce_y)_3Al_5O_{12}$ particles and the $Al_2O_3$ particles, a ratio of an average particle diameter of the $Al_2O_3$ particles to the average particle diameter of the $(Y_{1-x-y}, Gd_x, Ce_y)_3Al_5O_{12}$ particles is 1 or more and 2 or less, and the sintered body has a total thickness of 150 μm or more and 250 μm or less.

3 Claims, 1 Drawing Sheet

(58) Field of Classification Search
USPC .......................................................... 313/503
See application file for complete search history.

(56) References Cited

U.S. PATENT DOCUMENTS

2021/0179932 A1    6/2021  Yanagihara et al.
2021/0359170 A1*  11/2021  Garoni ................ H01L 33/501

* cited by examiner

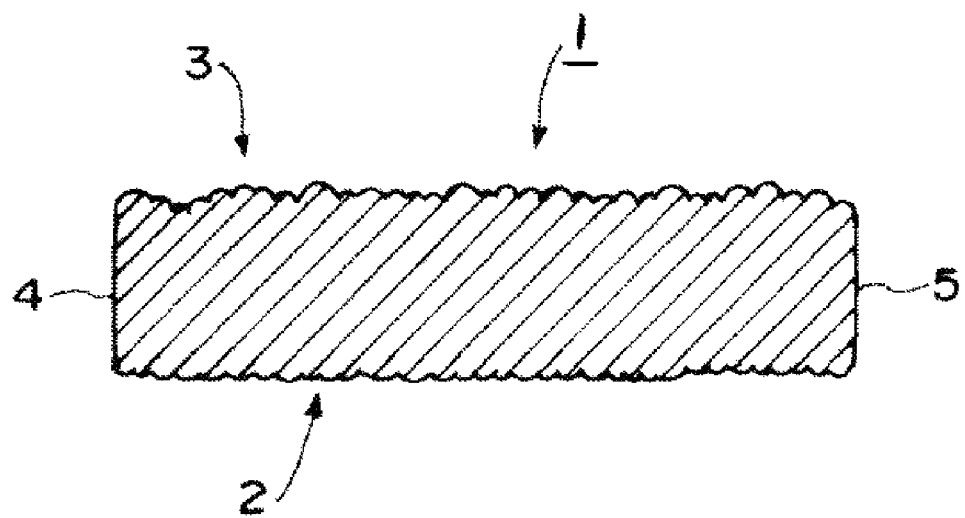

PHOSPHOR PLATE

TECHNICAL FIELD

The present invention relates to a phosphor plate that produces white light by wavelength-converting light from a light-emitting diode (LED) and, more specifically, to a phosphor plate used for high-luminance white illumination.

BACKGROUND ART

LEDs are now applied to cellphones, various display devices, etc. from the viewpoints of power saving, life elongation, size reduction, etc. Furthermore, with the recent increase in emission efficiency, LEDs are attracting much attention also in illumination use and are spreading rapidly.

At present, in white LED illumination, the mainstream method for obtaining white light is to mix light emitted from a blue LED and outgoing light from a phosphor that emits yellow light which is complementary color of blue in response to the blue light incident from the blue LED. In general, such wavelength conversion member using a phosphor is conventionally of such a type that phosphor powder is dispersed in resin. However, in recent years, from the viewpoint of heat resistance, wavelength conversion members that are composite bodies including ceramic have come to be used widely.

However, in LED illumination that is required to be uniform in emission color, wavelength conversion members that are ceramic composite bodies have a problem that color unevenness is prone to occur.

In this situation, for example, Patent document 1 discloses a manufacturing method of a wavelength conversion member that is high in emission light intensity and light conversion efficiency, including the steps of preparing a formed body containing an yttrium aluminum garnet-based phosphor having a composition represented by the following Equation (1) and alumina particles with an alumina purity of higher than or equal to 99.0 mass %, obtaining a first sintered body by performing primary firing on the formed body, and obtaining a second sintered body by performing secondary firing on the first sintered body by hot isostatic pressing (HIP):

$$(Y_{1-a-b}Gd_aCe_b)_3Al_5O_{12} \quad (1)$$

where a and b respectively satisfy $0 \le a \le 0.3$ and $0 < b \le 0.022$.

Patent document 1 discloses that it is preferable that the wavelength conversion member obtained by this manufacturing method be such that in Equation (1) the Ce proportion b is larger than 0 and smaller than or equal to 0.022 (i.e., $0 < b \le 0.022$). However, Examples merely show cases in which b is smaller than or equal to 0.009. In these Examples, to obtain a desired fluorescence wavelength with the Ce proportion being smaller than or equal to 0.009, it would be necessary to dope a large amount of Gd, posing a problem that when this wavelength conversion member is used in an LED light emission device the wavelength conversion efficiency would decrease as the temperature increases.

Furthermore, Patent document 1 discloses that it is preferable that the average particle diameters of the yttrium aluminum garnet-based phosphor and the alumina particles at the stage of preparing a formed body be 1 μm or more and 50 μm or less and 0.2 μm or more and 1.3 μm or less, respectively. However, there is no disclosure as to the particle diameter in the sintered body obtained by firing. Thus, it cannot be said that in this document sufficient consideration was given to maximizing the emission efficiency of the yttrium aluminum garnet-based phosphor and various issues relating to the sintered body that are caused by inclusion of alumina particles, such as a chromaticity variation due to scattering, an orientation characteristic, and in-plane uniformity (reduction of color unevenness).

[Patent document 1] JP-A-2018-172628

SUMMARY OF INVENTION

Although wavelength conversion members that are high in light emission intensity and light conversion efficiency have been obtained so far, further improvements need to be made in the chromaticity, orientation characteristic, and color unevenness.

An object of the present invention is to provide a white-light-emitting phosphor plate that is large in light flux, small in emission efficiency reduction due to temperature increase, small in chromaticity difference, and suppressed in in-plane unevenness.

A phosphor plate of the present invention includes a sintered body including $(Y_{1-x-y}, Gd_x, Ce_y)_3Al_5O_{12}$ particles and $Al_2O_3$ particles, in which x and y respectively satisfy $0.07 \le x \le 0.11$ and $0.010 \le y \le 0.015$, the $(Y_{1-x-y}, Gd_x, Ce_y)_3Al_5O_{12}$ particles in the sintered body has an average particle diameter of 4 μm or more and 6 μm or less, the $(Y_{1-x-y}, Gd_x, Ce_y)_3Al_5O_{12}$ particles has a concentration of 20 vol % or more and 30 vol % or less with respect to a total amount 100 vol % of the $(Y_{1-x-y}, Gd_x, Ce_y)_3Al_5O_{12}$ particles and the $Al_2O_3$ particles, a ratio $(Al_2O_3/(Y_{1-x-y}, Gd_x, Ce_y)_3Al_5O_{12}$ of an average particle diameter of the $Al_2O_3$ particles to the average particle diameter of the $(Y_{1-x-y}, Gd_x, Ce_y)_3Al_5O_{12}$ particles is 1 or more and 2 or less, and the sintered body has a total thickness of 150 μm or more and 250 μm or less.

It is preferable that a Gd/Ce content ratio (x/y) in the phosphor plate is 5.8 or more and 9.24 or less.

The present invention can provide a white-light-emitting phosphor plate that is large in light flux, small in emission efficiency reduction due to temperature increase, and small in chromaticity difference.

BRIEF DESCRIPTION OF DRAWING

The figure is a schematic sectional view of a sintered body that constitutes a phosphor plate of the present invention.

DETAILED DESCRIPTION OF EMBODIMENT

A phosphor plate of the present invention will be hereinafter described in detail.

The phosphor plate of the present invention includes a sintered body including $(Y_{1-x-y}, Gd_x, Ce_y)_3Al_5O_{12}$ particles and $Al_2O_3$ particles where x and y respectively satisfy $0.07 \le x \le 0.11$ and $0.010 \le y \le 0.015$. The average particle diameter of the $(Y_{1-x-y}, Gd_x, Ce_y)_3Al_5O_{12}$ particles in the sintered body is 4 μm or more and 6 μm or less. The concentration of the $(Y_{1-x-y}, Gd_x, Ce_y)_3Al_5O_{12}$ particles is 20 vol % or more and 30 vol % or less with respect to a total amount 100 vol % of the $(Y_{1-x-y}, Gd_x, Ce_y)_3Al_5O_{12}$ particles and the $Al_2O_3$ particles. The ratio $(Al_2O_3/(Y_{1-x-y}, Gd_x, Ce_y)_3Al_5O_{12})$ of an average particle diameter of the $Al_2O_3$ particles to the average particle diameter of the $(Y_{1-x-y}, Gd_x, Ce_y)_3Al_5O_{12}$ particles is 1 or more and 2 or less. The total thickness of the sintered body is 150 μm or more and 250 μm or less. The porosity of the sintered body is preferably 1.0% or less.

To obtain desired white light using an yttrium aluminum garnet (YAG)-based phosphor (hereinafter also referred to simply as a "phosphor"), it is necessary to control the fluorescence wavelength by the doping amounts of Gd and Ce. Doping a large amount of Gd deteriorates the temperature characteristic of the phosphor. The temperature characteristic means temperature dependence of the wavelength conversion efficiency. Deterioration of the temperature characteristic means that the wavelength conversion efficiency comes to lower as the temperature increases; lowering of the wavelength conversion efficiency is a factor in causing light flux reduction under high-temperature use. In ordinary phosphors, the wavelength conversion efficiency lowers as the temperature increases, that is, they have a problem relating to the temperature characteristic. On the other hand, a good temperature characteristic means that reduction of the wavelength conversion efficiency is a little even if the temperature increases. In this specification, the term "light flux" is an index of the brightness of white light that is obtained when a phosphor plate is mounted on a blue LED and emits white light.

On the other hand, doping a large amount of Ce which is a light emission element causes increase in light absorption amount. Thus, to allow transmission of more blue light, it is necessary to decrease the thickness of the phosphor or the Ce content. However, if the phosphor is too thin, blue light does not diffuse sufficiently in the phosphor, posing a problem in chromaticity difference. The chromaticity difference is an index of the orientation characteristic of white light, more specifically, a chromaticity difference ($\Delta CIE\_x = CIE\_x(60°) - CIE\_x(0°)$) between straight light (0°) and slant light (60°) of white light obtained when a phosphor plate is mounted on a blue LED and is caused to emit white light. To obtain high-luminance white light, it is preferable that the chromaticity difference (orientation characteristic) be as small as possible. If the phosphor content is made too small, the light flux decreases due to absorption by other mixing materials such as alumina.

On the other hand, if Ce is doped excessively, the efficiency of conversion from blue light to yellow light decreases due to concentration quenching, lowering the emission efficiency contrary to the intention.

Also in the $(Y_{1-x-y}, Gd_x, Ce_y)_3Al_5O_{12}$ particles (hereinafter also referred to simply as "YAG particles") used in the present invention, the doping amounts of Gd and Ce have proper values. The wavelength becomes longer when part of the Y sites of $(Y_{1-x-y}, Gd_x, Ce_y)_3Al_5O_{12}$ are replaced by Gd, and the wavelength becomes shorter when part of the Al sites are replaced by Gd. On the other hand, when part of the Y sites of $(Y_{1-x-y}, Gd_x, Ce_y)_3Al_5O_{12}$ are replaced by Ce, emission becomes broader by 5d-4f allowed transition. Based on these pieces of knowledge, the Gd content x and the Ce content y are $0.07 \leq x \leq 0.11$ and $0.010 \leq y \leq 0.015$, preferably $0.07 \leq x \leq 0.10$ and $0.011 \leq y \leq 0.014$. By setting x and y in the above numerical ranges in the $(Y_{1-x-y}, Gd_x, Ce_y)_3Al_5O_{12}$, white light emission that is large in light flux, good in temperature characteristic, and small in chromaticity difference can be obtained.

Where x is smaller than 0.07, to obtain desired white light it is necessary to make y larger than 0.015. The content y being larger than 0.015 decreases the emission efficiency and the light flux. On the other hand, where x is larger than 0.11, to obtain desired white light it is necessary to make y smaller than 0.010, which leads to deterioration of the temperature characteristic.

The average particle diameter of the YAG particles in the sintered body is 4 μm or more and 6 μm or less, preferably 4.4 μm or more and 5.6 μm or less. An average particle diameter is determined by measuring particle diameters by photographing the surface of the sintered body using a field emission scanning electron microscope (FE-SEM) and observing a resulting reflection electron image (according to ISO 13383-1: 2012). More specifically, an average particle diameter is determined by obtaining a 2,000x reflection electron image by photographing a cross section of the sintered body using an FE-SEM produced by Hitachi High-Tech Corporation, measuring maximum particle sizes of 200 particles observed therein, and calculating an average of them.

Where the average particle diameter is 4 μm or more and 6 μm or less, YAG particles are dispersed uniformly in the sintered body. Where YAG particles are dispersed uniformly, the phosphor plate has only a small number of voids and can provide high light conversion efficiency.

If the average particle diameter is smaller than 4 μm, YAG particles that is a phosphor component in the sintered body is low in crystallinity and hence the emission efficiency and the light flux decrease. If the average particle diameter is larger than 6 μm, blue light cannot diffuse sufficiently in the phosphor, whereby the chromaticity difference ($\Delta CIE\_x$) increases and the whiteness lowers.

In the sintered body, the concentration of the YAG particles is 20 vol % or more and 30 vol % or less, preferably 22 vol % or more and 26 vol % or less, with respect to a total amount 100 vol % of the YAG particles and the $Al_2O_3$ particles. A concentration of YAG particles is determined by calculating a ratio between a YAG phase and an $Al_2O_3$ phase by performing an XRD diffraction analysis on the phosphor plate.

If the concentration of the YAG particles is lower than 20 vol %, slight absorption in the $Al_2O_3$ layer decreases the light flux. On the other hand, if the concentration of the YAG particles is higher than 30 vol %, the scattering in the $Al_2O_3$ layer becomes insufficient, whereby the chromaticity difference, that is, the orientation characteristic deteriorates to cause color unevenness. The color unevenness means an in-plane chromaticity variation in the phosphor plate when it is mounted on a blue LED and emits white light. White light that is higher in uniformity can be obtained as the in-plane chromaticity variation becomes smaller.

Since the $Al_2O_3$ particles are a component constituting the sintered body other than the YAG particles, the concentration of the $A_2O_3$ particles is 70 to 80 vol %, preferably 74 to 78 vol % with respect to a total amount 100 vol % of the YAG particles and the $Al_2O_3$ particles. A concentration of $Al_2O_3$ particles can also be determined by performing an XRD diffraction analysis on the phosphor plate.

The ratio of the average particle diameter of the $Al_2O_3$ particles to the average particle diameter of the YAG particles is 1 or more and 2 or less. If this ratio is 1 or more and 2 or less, the phosphor plate becomes a highly efficient light emission element.

On the other hand, if the ratio of the average particle diameter of the $Al_2O_3$ particles to the average particle diameter of the YAG particles is smaller than 1, that is, if the $Al_2O_3$ particles are smaller than the YAG particles on average, although the emission efficiency of the YAG particles is high, the light extraction efficiency lowers and hence the light flux decreases because blue light and fluorescence are scattered excessively in the $Al_2O_3$ particles. If the ratio of the average particle diameter of the $Al_2O_3$ particles to the average particle diameter of the YAG particles is larger than 2, that is, if the $Al_2O_3$ particles are larger than the YAG particles on average, the emission efficiency of the phosphor plate lowers and hence the light flux decreases. Furthermore, color unevenness occurs because white light produced by the wavelength conversion is output without being diffused sufficiently.

Although there are no particular limitations on the manufacturing method of a sintered body of the present invention, an example manufacturing method is as follows. $Y_2O_3$ (average particle diameter: 0.3 to 3 µm), $CeO_2$ (average particle diameter: 0.1 to 1 µm), $Gd_2O_3$ (average particle diameter: 0.2 to 4 µm), and $Al_2O_3$ (average particle diameter: 0.2 to 10 µm) are prepared as raw materials. After average diameters of the respective materials are properly determined, the materials are mixed together so that a sintered body will have a prescribed composition. The mixture is formed, degreased, and fired in a vacuum atmosphere under a pressure of $1.0 \times 10^{-2}$ Pa or lower that is medium to low degree of vacuum. The figure shows a sectional view of the above-described sintered body. As shown in the figure, the phosphor plate of the present invention is a plate-like body in which one major surface is a light incident surface 2 and the other major surface, opposite to the light incident surface 2, is a light exit surface 3.

The light incident surface 2 and the light exit surface 3 are fired surfaces in which YAG particles and $Al_2O_3$ particles are exposed in an unprocessed state. The term "unprocessed state" means a state that a sintered body is left as fired after forming material powders, that is, a sintered body has not been subjected to any processing such as mechanical grinding or etching after the sintering. If the light incident surface 2 and the light exit surface 3 are subjected to processing such as mechanical grinding or etching after the sintering and are thus made to be processed surfaces, the mechanical strength of the phosphor plate lowers and cracks are prone to generate therein due to stress during mounting or use. Furthermore, there is a concern that troubles such as reduction in emission efficiency may be caused by a defect that occurred at the time of processing.

It is preferable that the arithmetic average roughness (Ra) at measurement length of 4 mm of the sintered body constituting the phosphor plate of the invention be 0.15 µm or more and 1.00 µm or less. If this condition is satisfied, the light extraction efficiency can be increased and hence the light flux can be increased. An arithmetic average roughness Ra is measured according to JIS B 0601: 1994.

The total thickness of the sintered body is 150 µm or more and 250 µm or less, preferably 180 µm or more and 230 µm or less. If the total thickness is smaller than 150 µm, the scattering is insufficient and hence the chromaticity difference deteriorates. On the other hand, if the total thickness is larger than 250 µm, the degree of scattering increases, the light extraction efficiency lowers, and the light flux decreases. The light extraction efficiency means efficiency of output of blue light and yellow light from the phosphor plate, and the product of the emission efficiency and the light extraction efficiency is an index of performance of the phosphor.

The Gd/Ce content ratio (x/y) of the sintered body is preferably in a range of 4 to 15, preferably 5.8 or more and 9.24 or less, even preferably 6.5 or more and 8.0 or less.

If the Gd/Ce content ratio (x/y) is less than 4, Gd concentration is low and there is a concern to result in a shorter wavelength emission than a desired fluorescence wavelength. Or because of a high Ce concentration, there is a concern that the emission efficiency is lowered by concentration quenching and hence the light flux decreases. On the other hand, if the Gd/Ce content ratio (x/y) is more than 15, which means that the Gd concentration is high and the Ce concentration is low, therefore there is a concern that the temperature characteristic deteriorates.

By setting the Gd/Ce content ratio (x/y) of the sintered body to be 5.8 or more and 9.24 or less (even preferably 6.5 or more and 8.0 or less), the fluorescence wavelength can be set more precisely, the lowering of the emission efficiency due to concentration quenching can be prevented, and higher light flux can be obtained. Furthermore, the temperature characteristic can be made higher.

The porosity of the sintered body is preferably 1.0% or less. By setting the porosity to be 1.0% or less, the mechanical strength of the phosphor plate can be made high. Furthermore, a phenomenon that incident light is scattered excessively, whereby the ratio of return light to the side of the light incident surface 2 increases to lower the emission efficiency can be prevented. A porosity is measured according to JIS R 1634: 1998.

EXAMPLES

The present invention will be described below in a specific manner referring to Examples. However, the invention is not limited by the following Examples.

[1] Preparation of $\{(Y_{1-x-y}, Gd_x, Ce_y)_3Al_5O_{12}+Al_2O_3\}$ Sintered Body A raw material powder was obtained by mixing together, at a prescribed mixing ratio, a cerium oxide powder of 0.5 µm in average particle diameter and 99.9% in purity, an yttrium oxide powder of 1.2 µm in average particle diameter and 99.9% in purity, a gadolinium oxide powder of 0.9 µm in average particle diameter and 99.9% in purity, and an aluminum oxide powder of 0.5 µm in average particle diameter and 99.9% in purity. The average particle diameters of $(Y_{1-x-y}, Gd_x, Ce_y)_3Al_5O_{12}$ particles and $Al_2O_3$ particles in a $\{(Y_{1-x-y}, Gd_x, Ce_y)_3Al_5O_{12}+Al_2O_3\}$ sintered body were adjusted by adjusting the particle diameters of the yttrium oxide powder, the gadolinium oxide powder, the cerium oxide powder, and the aluminum oxide powder. More specifically, in the case of adjusting the average particle diameter of the $(Y_{1-x-y}, Gd_x, Ce_y)_3Al_5O_{12}$ particles, the particle diameter of the yttrium oxide powder, the gadolinium oxide powder, and the cerium oxide powder in the raw material powder was adjusted. In the case of adjusting the average particle diameter of the $Al_2O_3$ particles, the particle diameter of the aluminum oxide powder in the raw material powder was adjusted.

Slurry was prepared by adding ethanol, a polyvinyl butyral (PVB)-based binder, and a glycerin-based plasticizer to the raw material powder and subjecting them to grinding and mixing for 40 hours using a ball mill having aluminum oxide balls.

The slurry was formed into a green sheet having a prescribed thickness by a doctor blade method. At this time, the overall thickness of a phosphor plate was adjusted by adjusting the thickness of the green sheet. A $\{(Y_{1-x-y}, Gd_x, Ce_y)_3Al_5O_{12}+Al_2O_3\}$ sintered body was obtained by degreasing and calcining the green sheet in the air and firing a resulting sheet at 1,700° C. under a vacuum atmosphere of $1.0 \times 10^{-2}$ Pa.

Samples of Examples 1-9 and Comparative Examples 1-14 shown in Table 1 were prepared by adjusting the above-mentioned conditions as appropriate and then subjected to the following evaluations.

[2] Evaluations of $\{(Y_{1-x-y}, Gd_x, Ce_y)_3Al_5O_{12}+Al_2O_3\}$ Sintered Body (Ce and Gd Concentrations)

Ce concentration y and Gd concentration x of each obtained phosphor plate were measured by an ICP atomic emission spectroscopy.

(Average Particle Diameters)

A reflection electron image of the surface of each phosphor plate was photographed by a field emission scanning electron microscope (FE-SEM) and then YAG particles and $Al_2O_3$ particles were identified. An average value of maximum lengths of YAG particles and an average of maximum lengths $Al_2O_3$ particles were employed as average particle diameters (unit: μm). The number of counted YAG particles and $Al_2O_3$ particles were respectively 200 or more.

(Proportion of $(Y_{1-x-y}, Gd_x, Ce_y)_3Al_5O_{12}$)

A proportion of YAG particles was determined by calculating a ratio between a YAG phase and an $Al_2O_3$ phase by performing an XRD diffraction analysis on the phosphor plate.

(Dominant Wavelength)

Each phosphor plate was cut into a 10-mm square size and set at the center of a 4-inch integrating sphere. The integrating sphere was irradiated with excitation light obtained by separating light emitted from a xenon lamp into a wavelength range 450±1 nm using a spectroscope. An emission spectrum of the phosphor plate was measured using a spectroscope "Fiber Multichannel Spectroscope USB4000" produced by Ocean Insight. A dominant wavelength of a fluorescence component in a wavelength range of 480 to 780 nm of the measured emission spectrum was calculated.

(Temperature Characteristic)

Each phosphor plate (10 mm×10 mm) was set at the center of a 4-inch integrating sphere having a heater. The integrating sphere was irradiated with excitation light in a wavelength range 450±1 nm in the same manner as in the above fluorescence wavelength measurement and quantum efficiency was measured at 25° C. and 200° C. from an emission spectrum of the phosphor plate. A value obtained by dividing the quantum efficiency at 200° C. by the quantum efficiency at 25° C. was employed as a temperature characteristic.

(Light Flux)

Each phosphor plate was worked into a 1-mm square size and fixed on a blue LED device (emission area: 1-mm square, emission wavelength: 450 nm) by silicone resin. Emission light was collected by the 4-inch integrating sphere and an emission spectrum was measured using the spectroscope "Fiber Multichannel Spectroscope USB4000" produced by Ocean Insight.

Light flux was calculated from the emission spectrum obtained. A light flux value obtained from a powder (22 vol %) of a YAG:Ce phosphor "P46-Y3" on the market produced by the Optronics Co., Ltd. (now Mitsubishi Chemical High-Technica Corporation) that was fixed to the same type of LED by phenyl silicone resin "OE-6630" on the market produced by Dow Corning Corp. was regarded as 100, and then the relative light flux of each examples was calculated.

(Chromaticity Difference)

Each phosphor plate was worked into a 1-mm square size and fixed on a blue LED device (emission area: 1-mm square, emission wavelength: 450 nm) by silicone resin. Of light emitted from the phosphor plate, chromaticity CIE_x in each of a front direction(0°) and an oblique direction(60°) was measured and a value obtained by subtracting the chromaticity CIE_x(0°) from the chromaticity CIE_x(60°) was employed as a chromaticity difference ΔCIE_x. A smaller chromaticity difference indicates better orientation characteristic of white light (orientation characteristic).

(Color Unevenness)

Each phosphor plate was worked into a 1-mm square size and fixed on a blue LED device (emission area: 1-mm square, emission wavelength: 450 nm) by silicone resin. Color unevenness of the emission surface of the phosphor plate was measured by a two-dimensional color luminance meter "CA-2500" produced by Conica Minolta, Inc. and the difference between a maximum value and a minimum value of the measured CIE_x values was employed as a color unevenness.

TABLE 1

|  | Gd concentration x | Ce concentration y | Gd/Ce concentration ratio (x/y) | $Al_2O_3$ average particle diameter (μm) | YAG average particle diameter (μm) | $Al_2O_3$ average particle diameter/YAG average particle diameter | Proportion of $(Y, Gd, Ce)_3Al_5O_{12}$ |
|---|---|---|---|---|---|---|---|
| Comp. Ex. 1 | 0.04 | 0.012 | 3.3 | 6.7 | 4.8 | 1.4 | 22 |
| Example 1 | 0.07 | 0.012 | 5.8 | 7.4 | 4.9 | 1.5 | 22 |
| Example 2 | 0.09 | 0.012 | 7.5 | 7.2 | 4.5 | 1.6 | 22 |
| Example 3 | 0.11 | 0.012 | 9.2 | 7.1 | 4.7 | 1.5 | 22 |
| Comp. Ex. 2 | 0.15 | 0.012 | 12.5 | 5.5 | 4.2 | 1.3 | 22 |
| Comp. Ex. 3 | 0.09 | 0.009 | 10.0 | 4.6 | 4.2 | 1.1 | 22 |
| Comp. Ex. 4 | 0.12 | 0.009 | 13.3 | 4.6 | 4.2 | 1.1 | 22 |
| Example 4 | 0.09 | 0.01 | 9.0 | 7.8 | 4.9 | 1.6 | 22 |
| Example 5 | 0.09 | 0.012 | 7.5 | 7.8 | 5.2 | 1.5 | 22 |
| Example 6 | 0.09 | 0.014 | 6.4 | 8.0 | 5.3 | 1.5 | 22 |
| Comp. Ex. 5 | 0.09 | 0.016 | 5.6 | 9.9 | 5.8 | 1.7 | 22 |
| Comp. Ex. 6 | 0.07 | 0.019 | 3.7 | 9.4 | 5.9 | 1.6 | 22 |
| Comp. Ex. 7 | 0.09 | 0.012 | 7.5 | 4.2 | 5.3 | 0.8 | 22 |
| Example 7 | 0.09 | 0.012 | 7.5 | 4.3 | 4.3 | 1 | 22 |
| Example 8 | 0.09 | 0.012 | 7.5 | 6.2 | 4.4 | 1.4 | 22 |
| Example 9 | 0.09 | 0.012 | 7.5 | 8.8 | 4.4 | 2 | 22 |
| Comp. Ex. 8 | 0.09 | 0.012 | 7.5 | 12.5 | 5.7 | 2.2 | 22 |
| Comp. Ex. 9 | 0.09 | 0.012 | 7.5 | 4.6 | 4.2 | 1.1 | 15 |
| Comp. Ex. 10 | 0.09 | 0.012 | 7.5 | 10.3 | 5.7 | 1.8 | 35 |
| Comp. Ex. 11 | 0.09 | 0.012 | 7.5 | 3.8 | 2.5 | 1.5 | 22 |
| Comp. Ex. 12 | 0.09 | 0.012 | 7.5 | 10.8 | 8.3 | 1.3 | 22 |

TABLE 1-continued

| | | | | | | |
|---|---|---|---|---|---|---|
| Comp. Ex. 13 | 0.09 | 0.012 | 7.5 | 9.0 | 5.0 | 1.8 | 22 |
| Comp. Ex. 14 | 0.09 | 0.012 | 7.5 | 7.5 | 5.0 | 1.5 | 22 |

| | Thickness (μm) | Dominant wavelength (nm) | Temperature characteristic (200° C./25° C.) | Light flux | Chromaticity difference ΔCIE_x (60° − 0°) | In-plane emission unevenness ΔCIE_x |
|---|---|---|---|---|---|---|
| Comp. Ex. 1 | 200 | 568.9 | 85 | 110 | 0.042 | 0.16 |
| Example 1 | 200 | 569.3 | 80 | 110 | 0.046 | 0.17 |
| Example 2 | 200 | 569.6 | 76 | 110 | 0.044 | 0.17 |
| Example 3 | 200 | 569.9 | 73 | 110 | 0.044 | 0.16 |
| Comp. Ex. 2 | 200 | 570.5 | 65 | 108 | 0.035 | 0.13 |
| Comp. Ex. 3 | 200 | 568.8 | 78 | 104 | 0.030 | 0.11 |
| Comp. Ex. 4 | 200 | 569.3 | 72 | 104 | 0.030 | 0.11 |
| Example 4 | 200 | 569.4 | 77 | 110 | 0.048 | 0.18 |
| Example 5 | 200 | 569.6 | 76 | 111 | 0.048 | 0.18 |
| Example 6 | 200 | 569.9 | 75 | 111 | 0.049 | 0.18 |
| Comp. Ex. 5 | 200 | 570.1 | 74 | 103 | 0.060 | 0.15 |
| Comp. Ex. 6 | 200 | 570.2 | 77 | 98 | 0.058 | 0.15 |
| Comp. Ex. 7 | 200 | 569.6 | 76 | 96 | 0.030 | 0.11 |
| Example 7 | 200 | 569.6 | 76 | 108 | 0.029 | 0.11 |
| Example 8 | 200 | 569.6 | 76 | 109 | 0.039 | 0.14 |
| Example 9 | 200 | 569.6 | 76 | 110 | 0.052 | 0.2 |
| Comp. Ex. 8 | 200 | 569.6 | 76 | 98 | 0.074 | 0.28 |
| Comp. Ex. 9 | 200 | 569.6 | 76 | 103 | 0.024 | 0.11 |
| Comp. Ex. 10 | 200 | 569.6 | 76 | 113 | 0.070 | 0.22 |
| Comp. Ex. 11 | 200 | 569.6 | 76 | 100 | 0.023 | 0.09 |
| Comp. Ex. 12 | 200 | 569.6 | 76 | 116 | 0.069 | 0.26 |
| Comp. Ex. 13 | 130 | 569.6 | 76 | 114 | 0.084 | 0.2 |
| Comp. Ex. 14 | 300 | 569.6 | 76 | 98 | 0.031 | 0.27 |

As seen from the above results, it has been confirmed that a phosphor plate that is superior in orientation characteristic, light flux, and temperature characteristic can be obtained by establishing relationships $0.07 \leq x \leq 0.11$ and $0.010 \leq y \leq 0.015$ in the $(Y_{1-x-y}, Gd_x, Ce_y)_3Al_5O_{12}$ particles.

It has been confirmed that a phosphor plate that is superior in orientation characteristic and light flux can be obtained by setting the average particle diameter of the $(Y_{1-x-y}, Gd_x, Ce_y)_3Al_5O_{12}$ particles to be 4 μm or more and 6 μm or less.

It has been confirmed that a phosphor plate that is superior in light flux, orientation characteristic, and color unevenness can be obtained by setting the concentration of the $(Y_{1-x-y}, Gd_x, Ce_y)_3Al_5O_{12}$ particles to be 20 vol % or more and 30 vol % or less.

It has been confirmed that a phosphor plate that is superior in light flux and color unevenness can be obtained by setting the ratio $(Y_{1-x-y}, Gd_x, Ce_y)_3Al_5O_{12})$ of an average particle diameter of the $Al_2O_3$ particles to an average particle diameter of the $(Y_{1-x-y}, Gd_x, Ce_y)_3Al_5O_{12}$ particles to be 1 or more and 2 or less.

It has been confirmed that a phosphor plate that is superior in light flux and orientation characteristic can be obtained by setting the total thickness of the sintered body to be 150 μm or more and 250 μm or less.

It has been confirmed that a phosphor plate that is superior in light flux and temperature characteristic can be obtained by setting the Gd/Ce content ratio (x/y) to be 5.8 or more and 9.24 or less.

This application is based on a Japanese patent application filed on Dec. 28, 2020 (Patent Application No. 2020-218582) and a Japanese patent application filed on Mar. 10, 2021 (Patent Application No. 2021-162683), the contents thereof being incorporated herein by reference.

DESCRIPTION OF SYMBOLS

1: Sintered body
2: Light incident surface
3: Light exit surface
4: Side surface
5: Side surface

What is claimed is:

1. A phosphor plate comprising a sintered body comprising $(Y_{1-x-y}, Gd_x, Ce_y)_3Al_5O_{12}$ particles and $Al_2O_3$ particles,
   wherein x and y respectively satisfy $0.07 \leq x \leq 0.11$ and $0.010 \leq y \leq 0.015$,
   the $(Y_{1-x-y}, Gd_x, Ce_y)_3Al_5O_{12}$ particles in the sintered body has an average particle diameter of 4 μm or more and 6 μm or less,
   the $(Y_{1-x-y}, Gd_x, Ce_y)_3Al_5O_{12}$ particles has a concentration of 20 vol % or more and 30 vol % or less with respect to a total amount 100 vol % of the $(Y_{1-x-y}, Gd_x, Ce_y)_3Al_5O_{12}$ particles and the $Al_2O_3$ particles,
   a ratio $(Al_2O_3/Y_{1-x-y}, Gd_x, Ce_y)_3Al_5O_{12}$ of an average particle diameter of the $Al_2O_3$ particles to the average particle diameter of the $(Y_{1-x-y}, Gd_x, Ce_y)_3Al_5O_{12}$ particles is 1 or more and 2 or less, and
   the sintered body has a total thickness of 150 μm or more and 250 μm or less.

2. The phosphor plate according to claim 1, wherein a Gd/Ce content ratio (x/y) in the phosphor plate is 5.8 or more and 9.24 or less.

3. The phosphor plate according to claim 1, wherein the sintered body has a porosity of 1.0% or less.

* * * * *